United States Patent
Ishino

(10) Patent No.: US 10,096,642 B2
(45) Date of Patent: Oct. 9, 2018

(54) PHOTOELECTRIC CONVERSION DEVICE, METHOD OF MANUFACTURING THE SAME, AND X-RAY IMAGE DETECTOR

(71) Applicant: NLT Technologies, Ltd., Kanagawa (JP)

(72) Inventor: Takayuki Ishino, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 118 days.

(21) Appl. No.: 14/051,247

(22) Filed: Oct. 10, 2013

(65) Prior Publication Data

US 2014/0103347 A1    Apr. 17, 2014

(30) Foreign Application Priority Data

Oct. 12, 2012  (JP) .................................. 2012-226679

(51) Int. Cl.
  *H01L 27/14*   (2006.01)
  *H01L 27/146*  (2006.01)

(52) U.S. Cl.
  CPC .. *H01L 27/14663* (2013.01); *H01L 27/14659* (2013.01); *H01L 27/14689* (2013.01); *H01L 27/14692* (2013.01)

(58) Field of Classification Search
  CPC ......... H01L 27/14663; H01L 27/14659; H01L 27/14689; H01L 27/14692; H01L 27/14; H01L 27/146; H01L 27/14601

(Continued)

(56) References Cited

U.S. PATENT DOCUMENTS

2009/0057564 A1* 3/2009 Miyayama .............. G01T 1/241
                                                         250/370.09
2009/0267121 A1* 10/2009 Ishida et al. ................... 257/292

(Continued)

FOREIGN PATENT DOCUMENTS

JP   2004-063660 A   2/2004
JP   2009-147203 A   7/2009

(Continued)

OTHER PUBLICATIONS

Communication issued by the Japanese Patent Office dated Jun. 28, 2016 in counterpart Japanese Patent Application No. 2012-226679 with English translation.

*Primary Examiner* — Michael Lebentritt
*Assistant Examiner* — Suberr Chi
(74) *Attorney, Agent, or Firm* — Sughrue Mion, PLLC

(57) ABSTRACT

Provided are a photoelectric conversion device, a method of manufacturing the photoelectric conversion device, and an X-ray image detector. A photoelectric conversion device at least includes a photodiode device. The photodiode device includes a lower electrode and an upper electrode, and a photoelectric conversion layer put between the lower and upper electrodes, where the photoelectric conversion layer includes a patterned edge surface, is smaller in size than the lower electrode and is placed on a surface of the lower electrode. The photodiode device further includes a protecting film covering at least the patterned edge surface of the photoelectric conversion layer. The protecting film except for an area where a contact hole is formed and the lower electrode are formed with a same-shaped pattern.

19 Claims, 12 Drawing Sheets

(58) Field of Classification Search
USPC .................................. 257/53, 59, 292, 443
See application file for complete search history.

(56) References Cited

U.S. PATENT DOCUMENTS

| | | |
|---|---|---|
| 2011/0073979 A1 | 3/2011 | Okada |
| 2011/0180889 A1* | 7/2011 | Jung ................. H01L 27/14663 257/428 |
| 2011/0248176 A1 | 10/2011 | Mochizuki et al. |

FOREIGN PATENT DOCUMENTS

| | | |
|---|---|---|
| JP | 2010-067762 A | 3/2010 |
| JP | 2011-77184 | 4/2011 |
| JP | 2011-238897 | 11/2011 |

* cited by examiner

PHOTOELECTRIC CONVERSION DEVICE, METHOD OF MANUFACTURING THE SAME, AND X-RAY IMAGE DETECTOR

CROSS REFERENCE TO RELATED APPLICATIONS

This application is based on Japanese Patent Application No. 2012-226679 filed on Oct. 12, 2012, in the Japan Patent Office, the entire content of which is hereby incorporated by reference.

TECHNICAL FIELD

The present invention relates to a photoelectric conversion device, a method of manufacturing of the same and an X-ray image detector. Especially, the present invention relates to a photodiode array substrate wherein photodiodes (hereinafter, referred as PDs) each connected to a thin-film transistor (hereinafter, referred as a TFT) are arranged in a matrix, a method of manufacturing the same and an X-ray image detector equipped with the PD array substrate.

BACKGROUND

Photoelectric conversion devices are employed for devices such as image sensors and X-ray image detectors. Especially, an X-ray image detector employing a flat panel such as the PD array substrate is called as a flat-panel X-ray detector (also called as a Flat Panel Detector, which is referred as a FPD hereinafter). Corresponding to the recent spread of digitization of image signals, the replacement of conventional analog films by FPDs for static images is advancing in the field of photographic devices, and the replacement of IIs (Image Intensifiers) by FPDs for moving images is advancing in the field of fluoroscopic devices. Therefore, FPDs are important devices in the field of medical image diagnostic apparatuses.

FPDs are divided in devices of a direct conversion type and devices of an indirect conversion type by their method of converting X-rays to electric charges. The devices of the direct conversion type use a conversion layer made of a material such as selenium (Se) to convert X-rays directly into charges. The devices of the indirect conversion type use a scintillator made of a material such as cesium iodide (CsI) and mounted on the above-described PD array substrate, to convert X-rays into visible rays with the scintillator and successively to perform a photoelectric conversion with PDs. The indirect conversion type exhibits a higher S/N ratio and can take images with a low-dose X-ray irradiation in comparison with the direct conversion type. Therefore, many FPDs of the indirect conversion type are being developed because they can achieve a reduction of levels of patient exposure. Especially, PDs with higher sensitivity are required in order to realize a much more reduction of patient exposure, for fluoroscopic devices.

The following characteristics are required for PD devices with high sensitivity: "high quantum efficiency" so as to achieve an effective photoelectric conversion though the amount of photons is extremely small; "low dark current" so as to keep a small amount of electrons after the conversion; and "small diode capacity" so as to restrict image lag and realize high-speed responsibility. These characteristics can be realized by increasing the thickness of a photoelectric conversion layer. However, the increased thickness of a photoelectric conversion layer can cause a layer separation in the manufacturing process, concretely, in the step of forming the layer and the succeeding steps, which has been a problem.

The main factor causing the problem is a membrane stress coming from the shrinkage difference among layers constituting the device, which is caused because of a temperature change from a high temperature state to a room temperature in the layering process. By lowering the layering temperature, the primary part of the shrinkage can be reduced and the layer separation to be generated in the whole part of the substrate can be solved, which can be easily imagined. However, it hardly solves a local layer separation which is caused when a difference in layer shrinkage is caused locally, for example, at the border of a patterned structure formed on the base, and membrane stress concentrates at the point. Further, it means that the layering temperature which is important as a factor to control the membrane properties of the photoelectric conversion layer, is restricted. Therefore, a structure not to cause a layer separation therein is required also for the purpose to enlarge the controllability of the membrane properties.

Various technologies to solve the layer separation have been conventionally proposed. Japanese Unexamined Patent Application Publications (JP-A) Nos. 2009-147203 and 2004-063660 disclose the structure that, in view of the layer separation of the photoelectric conversion layer caused because a photoelectric conversion layer made of amorphous silicon and its base are not tightly coupled together, at least a base on which an isolated pattern of the photoelectric conversion layer does not include a layer made of silicon nitride.

However, especially when a thick photoelectric conversion layer is formed, the layer can greatly shrink in its layering and processing steps. Therefore, the difference in adhesion properties between an area where the base includes a silicon nitride film and an area where the base does not includes a silicon nitride film, and the difference in line expansion coefficient between structures in the base have made concentration of stress coming from the layer shrinkage in the photoelectric conversion layer, on the boundary of different patterned structures on the base, which have resulted in the layer separation generated locally. As described above, the prior arts has failed to solve the layer separation and caused low production yield and contamination of the device so as to affect other substrates.

In view of that, JP-A Nos. 2009-147203 and 2010-067762 disclose the structure that, on layering and processing the photoelectric conversion layer, the whole of the base is formed by a lower electrode layer. Thereby, there are no parts to cause the concentration of stress in the base of the photoelectric conversion layer, which reduces the local layer separation.

However, in the prior arts, the lower electrode layer is formed by a patterning process after the photoelectric conversion layer is patterned, since the whole of the base in processing the photoelectric conversion layer is composed of a lower electrode layer. As a supplementary explanation, various processing steps such as photolithography and etching are performed as the edge surface of the photoelectric conversion layer is left exposed. It means that the edge surface of the photoelectric conversion layer is contaminated with resist material, metal material of the lower electrode and impurities including those materials. Such a matter has caused a problem that the contamination can make an electrical leakage path between both electrodes of a photodiode and the dark current increases. Further, a protecting film is formed for the patterned photoelectric conversion layer, which results in embedment of the cause of leakage.

In view of that, JP-A No. 2010-067762 discloses a method to perform a cleaning treatment by hydrogen plasma on the contaminated edge surface of the photoelectric conversion layer before the protecting film is formed. Concretely, the upper electrode is formed of known light-shielding metal and there is provided a mask structure by forming a passivation layer on an ITO upper electrode because the cleaning treatment can deoxidize the upper electrode under the condition that the upper electrode is a conductive oxide film such as an ITO (Indium Tin Oxide) film.

However, in the prior arts, the above method can make deterioration of the aperture characteristics of a photodiode and make the manufacturing steps complicated. Further, the above method just provides a solution to remedy the contaminated condition by a cleaning treatment, and it can be considered that the contamination is not removed completely through the method. JP-A No. 2004-063660 discloses a method to process the lower electrode by patterning before the photoelectric conversion layer is formed. This method actually provides an effect that a leakage path is not created but does not solve the problem about the layer separation as described above. In other words, JP-A No. 2004-063660 discloses a technology which works on two problems of "layer separation" and "countermeasures against electric leakage" which are incompatible problems in prior arts, but does not completely solve the both problems.

In order to achieve a photodiode with high sensitivity, enhancement of the S/N ratio is essential and the dark current is required to be reduced sufficiently, as described above. Further, needless to say, manufacturing the device without layer separation is a fundamental premise. As described above, "a structure which causes no layer separation" and "a structure which causes no electric leakage path" can be separately realized but are incompatible to be realized simultaneously in the prior arts, which has been confirmed by the inventor.

Therefore, realizing both of the structures at the same time is a problem to be solved, but it is not preferable that this realization makes a secondary problem such as an increase of manufacturing cost and deterioration of the opening aperture or the fill factor. The present invention seeks to solve the problem.

SUMMARY

There are disclosed illustrative photoelectric conversion devices, each including a photodiode with high sensitivity having a structure that causes no layer separation of a photoelectric conversion layer; methods of manufacturing of the photoelectric conversion device, each realizing the manufacture without increasing the manufacturing cost of the photoelectric conversion device; and X-ray image detectors each equipped with the photoelectric conversion device, as embodiments of the present invention.

One of the embodiments of the present invention is a photoelectric conversion device comprising a photodiode device. The photodiode device includes a lower electrode and an upper electrode facing each other, and a photoelectric conversion layer put between the lower electrode and the upper electrode, where the photoelectric conversion layer includes a patterned edge surface, is smaller in size than the lower electrode and is placed on a surface of the lower electrode. The photodiode device further includes a protecting film covering at least the patterned edge surface of the photoelectric conversion layer. The protecting film except for an area where a contact hole is formed and the lower electrode are formed with a same-shaped pattern, where the contact hole is formed in the protecting film to connect the upper electrode and a bias line to be placed over the protecting film.

Another embodiment of the present invention is a photoelectric conversion device comprising a photodiode device. The photodiode device includes a lower electrode and an upper electrode facing each other, and a photoelectric conversion layer put between the lower electrode and the upper electrode, where the photoelectric conversion layer includes a $n^+$-silicon layer, an intrinsic-silicon layer and a $p^+$-silicon layer in order from a side of the lower electrode. The upper electrode, the $p^+$-silicon layer and a part of the intrinsic silicon layer at a side of the $p^+$-silicon layer are formed with a same-shaped pattern. The intrinsic-silicon layer has a stepped shape. The photodiode device further includes a protecting film covering at least a patterned edge surface of the p+-silicon layer and a patterned edge surface of the part of the intrinsic silicon layer. The protecting film except for an area where a contact hole is formed, the lower electrode, the $n^+$-silicon layer and a part of the intrinsic silicon layer at a side of the $n^+$-silicon layer are formed with a same-shaped pattern, where the contact hole is formed in the protecting film to connect the upper electrode and a bias line to be placed over the protecting film.

In each of the above photoelectric conversion devices, it is preferable that the lower electrode and the upper electrode face each other with the lower electrode projecting from the upper electrode by a projecting length, and a layer thickness of the intrinsic-silicon layer is smaller than the projecting length.

Another embodiment of the present invention is a method of manufacturing a photoelectric conversion device comprising a photodiode device including a lower electrode and an upper electrode facing each other and a photoelectric conversion layer put between the lower electrode and the upper electrode. The method comprises: forming a metal layer to be formed into the lower electrode; and forming the photoelectric conversion layer and the upper electrode by forming a layer to be formed into the photoelectric conversion layer and a metal layer to be formed into the upper electrode in order on the metal layer to be formed into the lower electrode, and by patterning the metal layer to be formed into the upper electrode and a layer to be formed into the photoelectric conversion layer. The method further comprises: forming a layer to be formed into a protecting film; and patterning the layer to be formed into the protecting film and the metal layer to be formed into the lower electrode with remaining a part of the layer to be formed into the protecting film covering at least a patterned edge surface of the photoelectric conversion layer.

Another embodiment of the present invention is a method of manufacturing a photoelectric conversion device comprising a photodiode device including a lower electrode and an upper electrode facing each other and a photoelectric conversion layer put between the lower electrode and the upper electrode, where the photoelectric conversion layer includes a $n^+$-silicon layer, an intrinsic-silicon layer and a $p^+$-silicon layer. The method comprises: forming a metal layer to be formed into the lower electrode; and forming the photoelectric conversion layer and the upper electrode by forming layers to be formed into the $n^+$-silicon layer, intrinsic-silicon layer and $p^+$-silicon layer, and a metal layer to be formed into the upper electrode in order on the metal layer to be formed into the lower electrode, and by patterning the metal layer to be formed into the upper electrode and the layers to be formed into the p+-silicon layer and the intrinsic-silicon layer up to a midway thickness of the intrinsic-silicon layer. The method further comprises: forming a layer to be formed into a protecting film; and patterning the layer to be formed into the protecting film, a remaining part of the layer to be formed into the intrinsic silicon layer, the layer to be formed into the n+-silicon layer and the metal layer to be formed into the lower electrode with remaining a part of the layer to be formed into the protecting film covering at least a patterned edge surface of the p+-silicon layer and a patterned edge surface of the intrinsic silicon layer.

In each of the above methods, it is preferable that the layer to be formed into the intrinsic-silicon layer is formed to have a thickness which is smaller than a projecting length of the lower electrode which projects from the upper electrode.

In each of the above methods, it is preferable that the patterning the layer to be formed into the protecting film and the metal layer to be formed into the lower electrode, includes patterning the metal layer to be formed into the lower electrode and the layer to be formed into the protecting film with a same-shaped pattern.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

DETAILED DESCRIPTION

Figure 1:
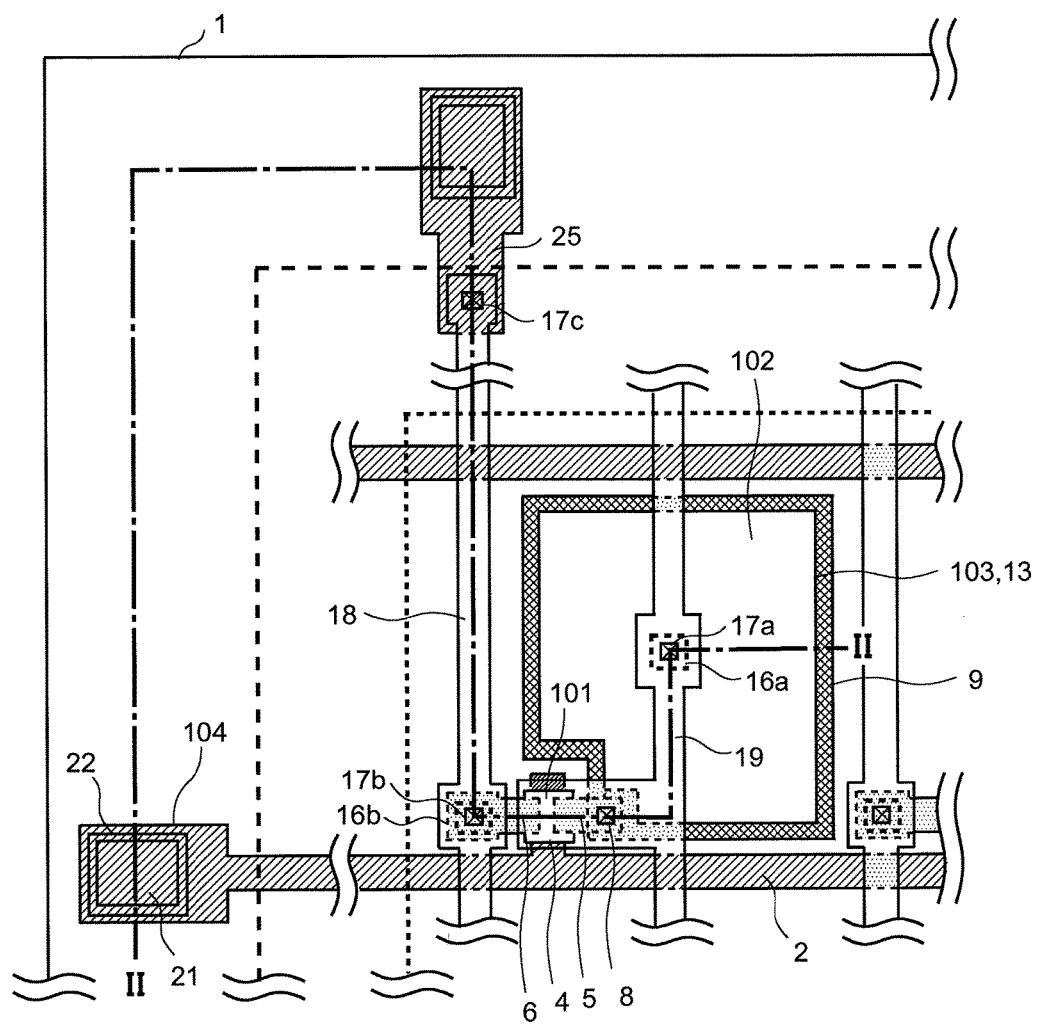
FIG. 1 is a plan view illustrating an array substrate to be mounted on a photoelectric conversion device of Example 1.

Illustrative embodiments of photoelectric conversion devices, methods of manufacturing of the same and X-ray image detectors will be described below with reference to the drawings. It will be appreciated by those of ordinary skill in the art that the description given herein with respect to those figures is for exemplary purposes only and is not intended in any way to limit the scope of potential embodiments may be resolved by referring to the appended claims.

As illustrated in the descriptions of background, conventional structures hardly realize both of "a structure not to cause a layer separation of a photoelectric conversion layer" and "a structure not to create an electric leakage path therein" because they are incompatible to be realized simultaneously. Further, attempting to realize them simultaneously, can cause problems that the manufacturing cost increases and the aperture ratio or fill-factor deteriorates.

In view of them, an embodiment of the present invention provides a structure that a lower electrode layer remains as the entire part of the base of the photoelectric conversion layer at least while a layer to be formed into a photoelectric conversion layer is formed and patterned. Thereby, there are provided no area which locally causes difference of stress coming from the adhesion properties between a photoelectric conversion layer formed of semiconductor and a lower electrode layer formed of metal and from an expansion and/shrinkage of them, which can provide a great effect to restrict the layer separation of the photoelectric conversion layer.

Further, as described above, the patterned upper electrode and the patterned photoelectric conversion layer are formed on a lower electrode layer which has been provided as the entire part of the base, and under the condition, a layer to be a protecting film is formed over the layer to be formed into the lower electrode and the patterned upper electrode and the patterned photoelectric conversion layer. In other words, right after of the photoelectric conversion layer has been exposed, the layer to be the protecting film is formed to cover the patterned edge surface. Thereby, there is no need to perform unwanted manufacturing steps on the exposed edge surface of the patterned photoelectric conversion layer, which can avoid the generation of an electric leakage path because of contamination.

After that, the protecting film and the lower electrode are formed with the same-shaped pattern to complete the photodiode device. At that time, it is important that the patterning of the protecting film and the lower electrode is performed through the same photolithography process. To perform just the patterning process on the lower electrode, the protecting film and the lower electrode may be separately processed by different photolithography processes. However, when the photolithography processes are separately performed, the device is required to be designed with considering manufacturing margins such as displacement of those patterns, which results in the reduction of areas of an active region and the photoelectric conversion layer. It means that the sensitivity of received light of the diode deteriorates because of decrease of the fill factor. Further, the divided photolithography processes for those components naturally increases the number of masks to be used and the number of manufacturing steps. Therefore, by forming the protecting film and the lower electrode by using the same-shaped pattern, the above effects can be realized without deterioration of properties of the diode, such as the sensitivity of received light, and increase of the manufacturing cost.

Further, the structure of the present embodiment provides the following effect which is different from a combination of the existing effects. That is, a photodiode array is composed of plural layers and plural interlayer films, wherein the components are connected through contact holes to another. In this structure, increase of the depth of contact holes (thickness of the interlayer films) causes various problems in manufacturing processes, for example, increase of lead time coming from performing an etching treatment on a thick interlayer film, quality change and sticking of a photo-resist film coming from a prolonged etching period, and an interlayer short circuit made due to a penetration in a pinhole section of the photo resist coming from an etching treatment. However, in the present embodiment, the protecting film covering the patterned edge surface of the photoelectric conversion layer is placed just on an area where the lower electrode exists as described above, which reduces layers to be etched to form a contact hole by one layer and provides additional effect that the problems which can be caused in the manufacturing processes is reduced.

For a concrete example of the construction at a terminal part of the gate layer, the conventional structure requires to perform an etching treatment on three layers of a photodiode protecting film, TFT passivation layer and gate insulating layer. In contrast, in the present embodiment, there is no need to perform an etching treatment on more than two layers of a TFT passivation layer and gate insulating layer, which provides a good effect.

Example 1

First, the structure of an array substrate of Example 1 will be described with reference to FIGS. 1 and 2A to 2C.

FIG. 1 is a plan view illustrating an array substrate to be mounted on a photoelectric conversion device of the present example. On the array substrate, there are provided plural gate lines 2 and plural signal lines 18 which orthogonally intersect to form a matrix shape. At each of positions corresponding to the intersection of the gate line 2 and signal line 18, gate line 2 and signal line 18 are connected to thin-film transistor 101 as a switching element and the thin-film transistor 101 is arranged with connecting to photodiode 102. Gate line 2 and signal line 18 are connected to terminals 104, respectively.

Figure 2A:
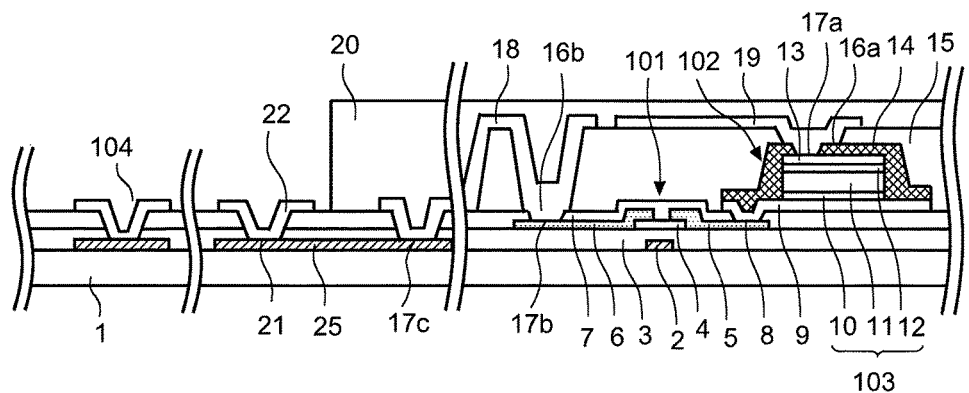
FIGS. 2A to 2C are sectional views taken along the II-II line of FIG. 1, illustrating the structure of Example 1 and the structures of modified examples.
Figure 2B:
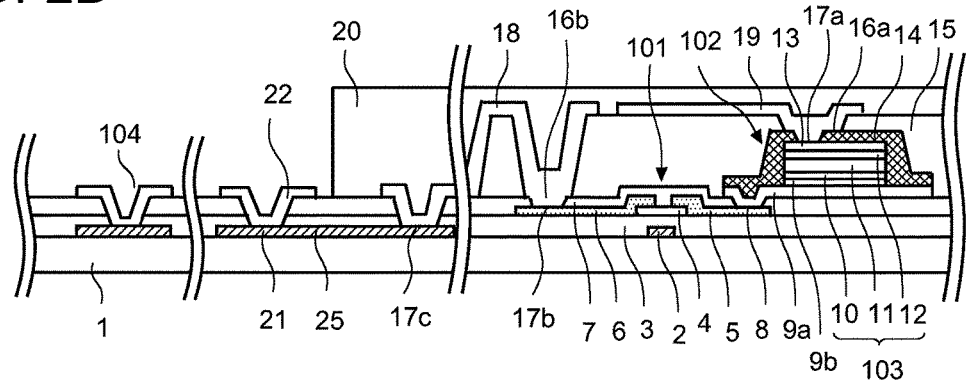
Figure 2C:
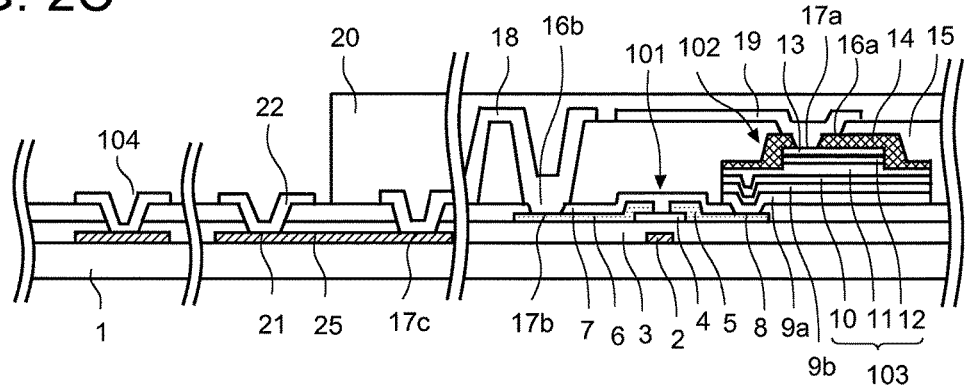

FIG. 2A is a sectional view taken along the line II-II of FIG. 1. There is provided substrate 1 with gate lines 2 and gate insulating layer 3 being put thereon, and patterned semiconductor layer 4 is formed over the substrate 1, gate lines 2 and gate insulating layer 3. On the semiconductor layer 4, there are arranged source electrode 5 and drain electrode 6 which are separated from each other at a distance corresponding to a channel length, and then, passivation layer 7 is formed to cover them to form thin-film transistor 101. Next, on the passivation layer 7, photodiodes 102 are arranged. Each of the photodiodes 102 includes lower electrode 9 and upper electrode 13 facing each other, patterned photoelectric conversion layer 103 formed between the lower electrode 9 and upper electrode 13, and first protecting film 14 as a protecting film. The first protecting film 14 except for an area where a contact hole is formed and the lower electrode are formed with a same-shaped pattern. The patterned photoelectric conversion layer 103 is composed of, in this order from the lower side (the side of the lower electrode), n$^+$-doped hydrogenated amorphous silicon layer (n$^+$-Si layer) 10, intrinsic hydrogenated amorphous silicon layer (i-Si layer) 11 and p$^+$-doped hydrogenated amorphous silicon layer (p$^+$-Si layer) 12. Further, source electrode 5 and lower electrode 9 are connected to each other through first contact hole 8 formed though passivation layer 7 so as to connect thin-film transistor 101 to photodiode 102. In this example, another lower electrode 9b as shown in FIGS. 2B and 2C may be arranged additionally between lower electrode 9 and n$^+$-Si layer 10 to be connected directly to photoelectric conversion layer 103.

On the workpiece, there are arranged second protecting film 15, bias lines 19 and signal lines 18. The upper electrode 13 and bias line 19 are connected to each other through second contact hole 16a formed through second protecting film 15 and third contact hole 17a formed through first protecting film 14. The drain electrode 6 and signal line 18 are connected to each other through second contact hole 16b formed through second protecting film 15 and third contact hole 17b formed through passivation layer 7. The signal line 18 and lead line 25 extending from a terminal are connected to each other through third contact hole 17c formed through gate insulating layer 3 and passivation layer 7.

Further on the workpiece, third protecting film 20 is formed to cover thin-film transistors 101, photodiodes 102, signal lines 18 and third contact holes 17c. Terminal 104 has a structure that lead line 25 and terminal electrode 22 are connected to each other through fourth contact hole 21 formed through gate insulating layer 3 and passivation layer 7.

Next, a method of manufacturing the array substrate having the above structure will be described with reference to FIGS. 3A to 3J. FIGS. 3A to 3J are sectional views illustrating manufacturing steps of the array substrate to be mounted on the photoelectric conversion device of the present example.

Figure 3A:
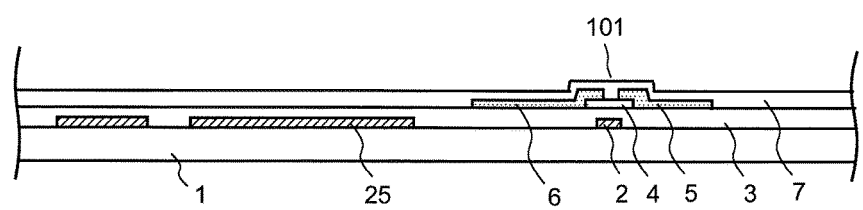
FIGS. 3A to 3J are sectional views illustrating manufacturing steps of the array substrate to be mounted on the photoelectric conversion device of Example 1.

First, as shown in FIG. 3A, there is prepared substrate 1 formed of base material which can resist a coming heating process, for example, as a silicon wafer and a glass which has a large surface area and is inexpensive. On the substrate 1, gate lines 2 and lead lines 25 from the terminals are formed to have the thickness of 200 nm to 500 nm by using a single or multiple layers made of metal which is generally used as line material with low resistance such as Cr, Mo, Al and alloy made of them. However, the lead lines 25 are not limited to be formed by the same layer of the gate lines 2. Next, gate insulating layer 3 is layered to be 200 nm to 500 nm in thickness by using one of a silicon nitride layer and silicon oxide layer or multiple layers of them, and then, semiconductor layer 4 is layered to be 100 nm to 400 nm in thickness, where the semiconductor layer 4 is provided as a multilayered structure made of hydrogenated amorphous silicon and n$^+$-doped hydrogenated amorphous silicon or a layer made of oxide semiconductor called as IGZO (oxide semiconductor including indium (In), gallium (Ga) and zinc (Zn)). The semiconductor layer 4 is patterned in an island shape on the gate electrode. After that, source electrode 5 and drain electrode 6 which are 100 nm to 200 nm in thickness are formed on the patterned semiconductor layer 4 with separating from the other by the channel length, by using a metal layer which is the same as that of gate lines 2. On the workpiece, passivation layer 7 is layered to be 100 nm to 500 nm in thickness by using one of a silicon nitride layer and silicon oxide layer or multiple layers of them, to form thin-film transistor 101 as a switching element.

Figure 3B:
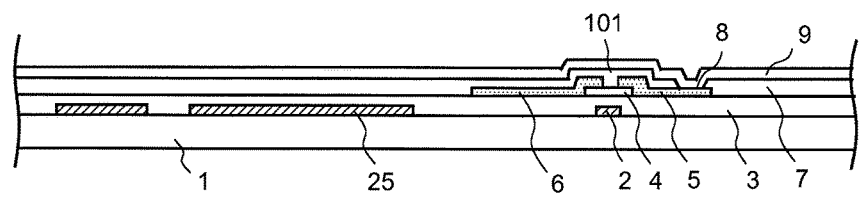

Next, as shown in FIG. 3B, first contact hole 8 is formed in passivation layer 7, and a metal layer made of material such as ITO, Cr, molybdenum-based alloy to be formed into lower electrode 9 is layered by about 40 nm to 200 nm thickness. Thereby, lower electrode 9 is connected to source electrode 5 through first contact hole 8.

When another lower electrode 9b is arranged between lower electrode 9 and n$^+$-Si layer to be formed later as shown in FIGS. 2B and 2C, the layer to be formed into the another lower electrode 9b is layered on the layer of lower electrode 9a. The additional lower electrode 9b to be arranged here, preferably has ohmic contact and adherent with n⁺-Si layer 10 which are superior to those of lower electrode 9a and preferably has excellent adherent with lower electrode 9a. Further, it is more preferable that the another lower electrode 9b has the structure not to cause the following malfunction even under the condition that photoelectric conversion layer 103 is exposed by an etching treatment, where the malfunction is a situation that the another lower electrode is etched together with the photoelectric conversion layer 103 and that metallic impurities contaminate the etched surface of photoelectric conversion layer 103. For example, another lower electrode 9b is formed by a metal layer made of material such as Cr and Ni to be 10 nm to 100 nm in thickness.

Figure 3C:
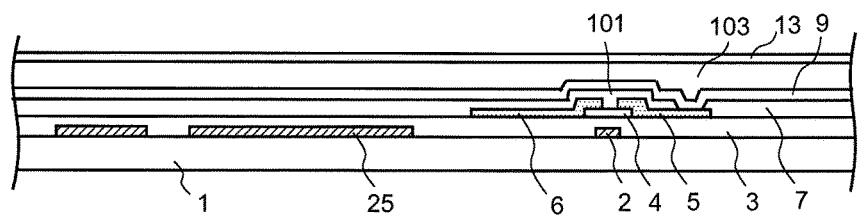

Next, as shown in FIG. 3C, on the layer of lower electrode 9 as a base covering the whole area, a multi-layered structure to be formed into photoelectric conversion layer 103 such as a pin diode is layered to be 0.5 µm to 2.5 µm in thickness, where the multi-layered structure is composed of n⁺-Si layer 10, i-Si layer 11 and p⁺-Si layer 12, and transparent conductive layer formed of material such as ITO to be formed into upper electrode 13 is further layered to be 20 nm to 100 nm in thickness. Herein, the multi-layered structure to be photoelectric conversion layer 103 is layered by a CVD process at the substrate temperature of 200° C. to 350° C.

Figure 3D:
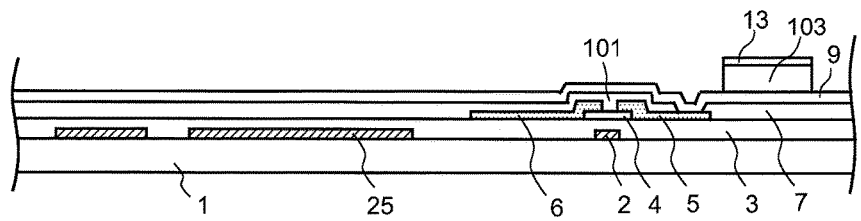

Next, as shown in FIG. 3D, the layer of upper electrode 13 and the multi-layered structure to be photoelectric conversion layer 103 are etched in sequence from an upper layer by using the same resist mask to be formed into the almost same island shape. As described above, since the multilayered structure to be photoelectric conversion layer 103 has been layered to be thick, etching the structure can cause a great side etching (which is a phenomenon that a structure is patterned into a smaller shape than the resist pattern). In view of that, when the layer of upper electrode 13 is selectively etched, upper electrode 13 is formed to be smaller than the final size of the patterned photoelectric conversion layer 103 by about 1 µm to 5 µm at each side part. It avoids forming a structure in a canopy shape such that upper electrode 13 becomes larger than the patterned photoelectric conversion layer 103, which makes the tapered shape of photoelectric conversion layer 103 in good condition and improves coatability of layers to be formed on structures including the upper electrode 13 in the following steps. As described above, forming photoelectric conversion layer 103 into an island shape physically avoids a generation of a crosstalk which is a phenomena that charges generated by photoelectric conversion are taken into the neighboring photoelectric conversion element, and further avoids the structural overlap of the photoelectric conversion layer 103 with gate line 2 and signal line 18 to reduce a parasitic capacitance of each line.

Figure 3E:
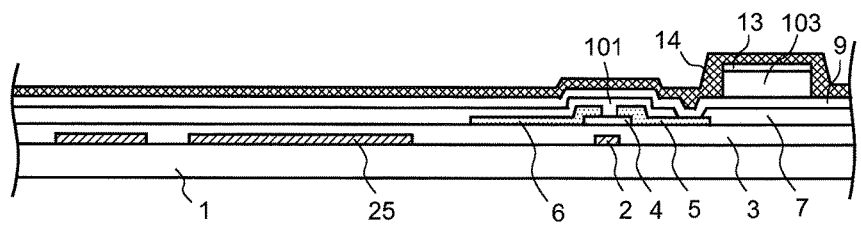

Next, as shown in FIG. 3E, a layer to be formed into first protecting film 14 is formed over the layer of the lower electrode, the patterned upper electrode and the patterned photoelectric conversion layer, to be 100 nm to 500 nm in thickness by using one of a silicon nitride layer and silicon oxide layer or multiple layers of them. Because right after the edge surface of the patterned photoelectric conversion layer 103 has been exposed, the patterned edge surface is subjected to a minimum necessary cleaning process such as washing and then is covered by first protecting film 14, the contamination on the edge surface of the patterned photoelectric conversion layer 103 can be reduced to the minimum level.

Figure 3F:
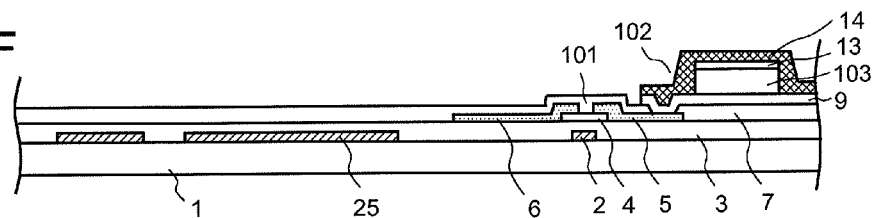

Next, as shown in FIG. 3F, layers of first protecting film 14 and lower electrode 9 are etched with a resist mask which has a larger pattern than that of upper electrode 13, sequentially from an upper layer, to be formed into almost the same shape, to form photodiode 102. When first protecting film 14 is etched, a layer of lower electrode 9 exists as a base covering the whole part of the processing area, and the layer of lower electrode 9 works as an etching stopper. This structure allows selectable removing of the layer to be first protecting film 14 with remaining a part where the resist mask is placed by an etching treatment, which does not increase the thickness of interlayer film excessively and contributes to a reduction of the lead time of the device and of damages coming from an etching treatment which can be caused in the succeeding steps to form contact holes.

Figure 3G:
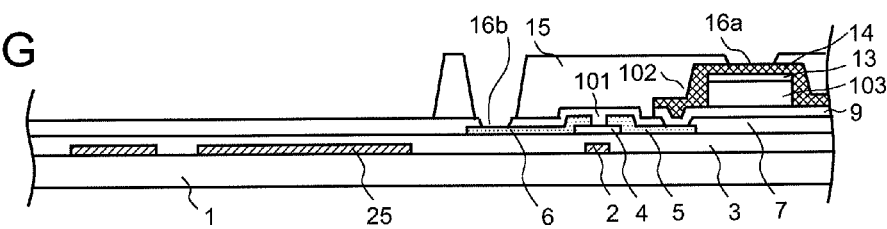

As shown in FIG. 3G, a transparent interlayer organic layer (transparent interlayer dielectric layer) is formed by depositing or applying material such as acrylic resin to form second protecting film 15. In the layer, second contact holes 16a and 16b are formed by a photolithography process.

Figure 3H:
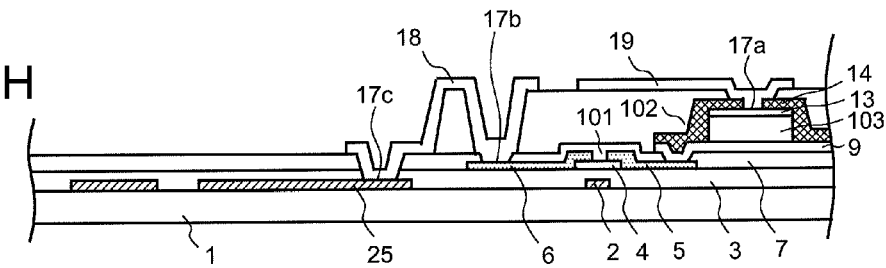

As shown in FIG. 3H, third contact holes 17a, 17b, 17c are simultaneously formed in first protecting film 14, passivation layer 7, and layered structure of passivation layer 7 and the layer of gate line 2, respectively. After that, a metal layer which is same as that of gate lines 2 is layered to be 200 nm to 500 nm in thickness to form signal lines 18 and bias lines 19. Thereby, bias line 19 is connected to upper electrode 13 through third contact hole 17a, signal line 18 is connected to drain electrode 6 through third contact hole 17b, and signal line 18 is connected to lead line 25 extending from the terminal through third contact hole 17c. The structure that signal lines 18 are separated from gate lines 2 and photoelectric conversion layer 103 across an organic interlayer film reduces a parasite capacity of signal line 18 and provides an effect of noise reduction.

Figure 3I:
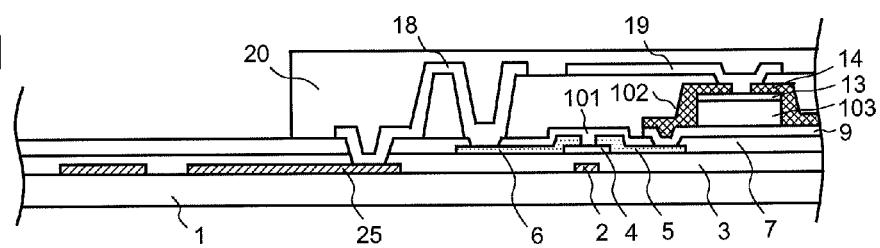

As shown in FIG. 3I, third protecting film 20 is formed by a depositing or applying process to be 1.0 µm to 2.0 µm by using a transparent interlayer organic layer (transparent interlayer dielectric layer) formed of material such as acrylic resin, one of a silicon nitride layer and silicon oxide layer or multiple layers of them. Then, the layer is patterned so as to remove a part to form terminals 104 through a photolithography process.

Figure 3J:
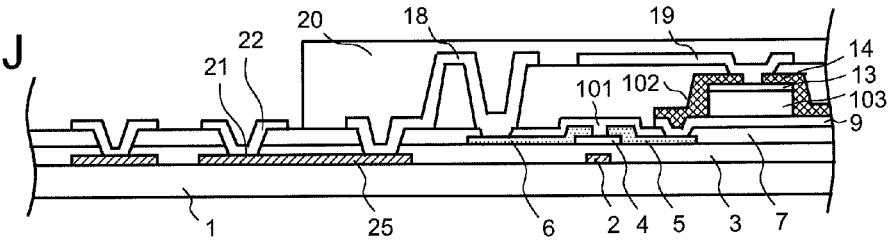

Finally, as shown in FIG. 3J, fourth contact hole 21 is formed in the layered structure of passivation layer 7 and gate insulating layer 3, and then, terminal electrode 22 is formed to be about 20 nm to 150 nm in thickness by a layer made of metal material which has excellent terminal connectivity such as ITO. This process establish a connection of terminal electrode 22 with lead line 25 extending from the terminal, and forms terminals 104 extending from gate lines 2, signal lines 18 and bias lines 19.

Figure 4:
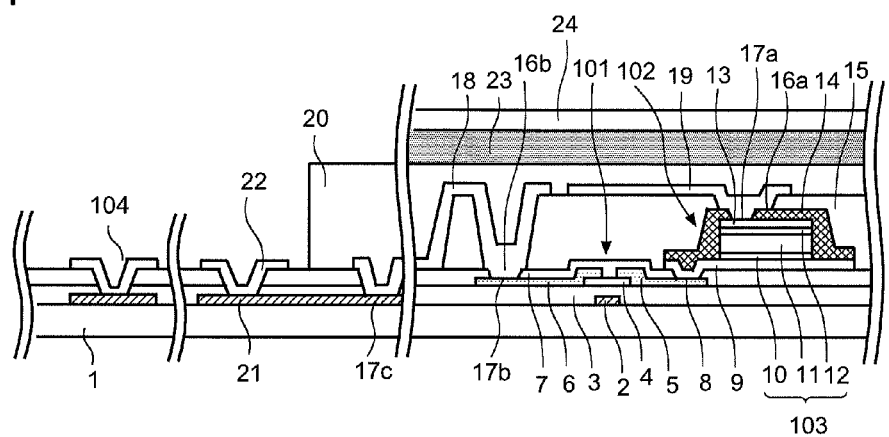
FIG. 4 is a sectional view illustrating a structure of a photoelectric conversion device having a function to perform radiation imaging.

A structure of radiation imaging device as an application of Example 1 will be described with reference to FIG. 4. FIG. 4 is a sectional view illustrating a structure of photoelectric conversion device having a function to perform radiological imaging, relating to Example 1. On the structure of Example 1 shown in FIG. 2A, phosphor 23 (scintillator) which is configured to convert radial rays to visible rays and is made of material such as cesium iodide (CsI) is formed over third protecting film 20 (transparent interlayer dielectric layer) by a direct layering process such as bonding and deposition. Then, on the resulting surface, phosphor protecting film 24 is formed.

Next, operations of the array substrate of Example 1 will be described with reference to FIG. 2A.

Photodiode 102 is connected to thin-film transistor 101 with lower electrode 9 and source electrode 5. Thin-film transistor 101 is connected to signal line 18 through gate line 2 and drain electrode 6. Photodiode 102 is connected to bias line 19 with upper electrode 13.

First, thin-film transistor 101 is turned on, and electric potential of signal line 18 is set to lower electrode 9. Voltage is applied to lower electrode 9 and upper electrode 13 so as to make the lower electrode 9 and the upper electrode 13 having an electric potential of bias line 19 reverse-biased. After that, thin-film transistor 101 is turned off, to keep the respective conditions of thin-film transistor 101 and photodiode 102, where the conditions kept are, for example, a reverse-biased condition of photodiode 102 such that voltage is applied to lower electrode 9 and upper electrode 13 to have the electric potential of 0V and the electric potential of −5V, respectively, and a high-resistant condition (off condition) of a channel section formed in semiconductor layer 4 of thin-film transistor 101 such that voltage which is lower than the threshold voltage such as −10V is applied to gate line 2. When leakage exists in thin-film transistor 101 or photodiode 102 under those conditions, charges moving due to the leakage make noises and ordinary images are hardly taken with the device.

When light enters photoelectric conversion layer 103 from the side of upper electrode 13 in the photodiode 102 kept under the above condition, electron-hole pairs are generated in photoelectric conversion layer 103. Electrons and holes move toward lower electrode 9 and upper electrode 13, respectively, because of the bias. Under the situation that photoelectric conversion layer 103 includes intrinsic hydrogenised amorphous silicon layer 11 as shown in the present example, the efficiency of photoelectric conversion becomes higher by using visible light as the incident light. When light enters, electrons are charged in lower electrode 9 and electric potential of lower electrode 9 becomes lower. On the other hand, holes move toward upper electrode 13 but are not charged because upper electrode 13 is connected to bias line 19. Therefore, upper electrode 13 keeps constant electric potential. In other words, only the electric potential of lower electrode 9 changes before and after of the light incident.

After that, thin-film transistor 101 is turned on, to transfer charges through signal line 18 in order to set the electric potential of lower electrode 9 to the original level which is the same as that before the light incident. At that time, the amount of transferred charges is measured with an integrated circuit connected to signal line 18. The amount of electrons which have been converted, moved and charged changes depending on the amount of incident light, and the measured amount of charges varies. By mapping the amount of charges obtained from each of photodiodes arranged in a matrix shape, an image taken with the device can be obtained.

Next, effects of the array substrate of Example 1 will be described with reference to FIGS. 3A to 3J, 7, 8, 9A to 9I and 10. FIG. 8 is a plan view illustrating an array substrate to be mounted on a conventional photoelectric conversion device. FIGS. 9A to 9I are sectional views illustrating manufacturing steps of the array substrate to be mounted on the conventional photoelectric conversion device. FIG. 10 is a diagram illustrating an example of a layer separation of a photoelectric conversion layer caused in manufacturing steps of the array substrate to be mounted on the conventional photoelectric conversion device.

FIG. 8 illustrates a conventional array substrate as compared to FIG. 2A illustrating an array substrate of Example 1. The same components as FIG. 2A are denoted by the same reference numerals in FIG. 8. FIGS. 9A-9I illustrate manufacturing steps of the conventional array substrate as compared to FIGS. 3A-3J illustrating manufacturing steps of the array substrate of Example 1. The same components as FIGS. 3A-3J are denoted by the same reference numerals in FIGS. 9A-9I.

To form photoelectric conversion layer 103, a thick layer is formed and is patterned into an island shape. Since the layer is formed under a high temperature, it can cause a trouble that the layer shrinks when being put out under the room temperature and atmospheric pressure and results in a great warp or layer separation. Conventionally, this trouble has been solved by forming the layer under the condition that the substrate temperature is lowered to the very limit not to make the deterioration of semiconductor characteristics in order to reduce the amount of layer shrinkage.

Figure 8:
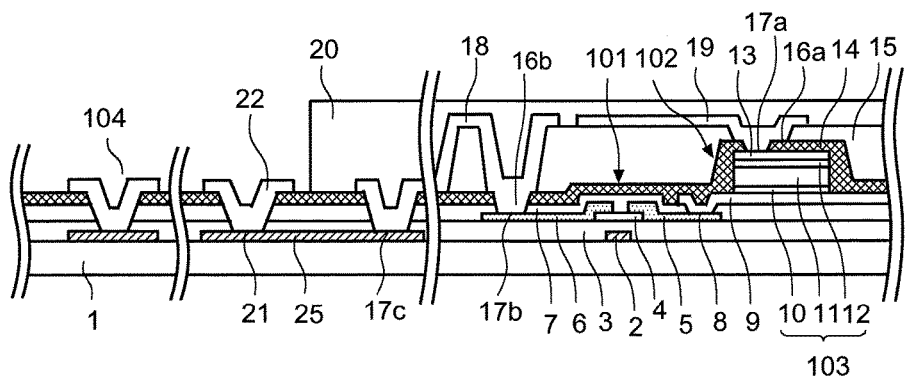
FIG. 8 is a plan view illustrating an array substrate to be mounted on a conventional photoelectric conversion device.
Figure 9A:
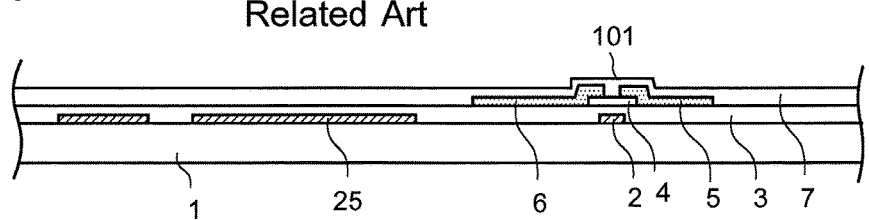
FIGS. 9A to 9I are sectional views illustrating manufacturing steps of the array substrate to be mounted on the conventional photoelectric conversion device.
Figure 9B:
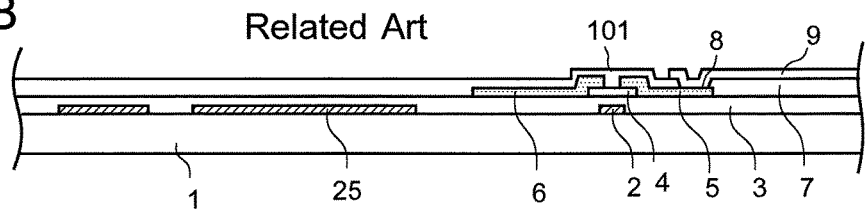
Figure 9C:
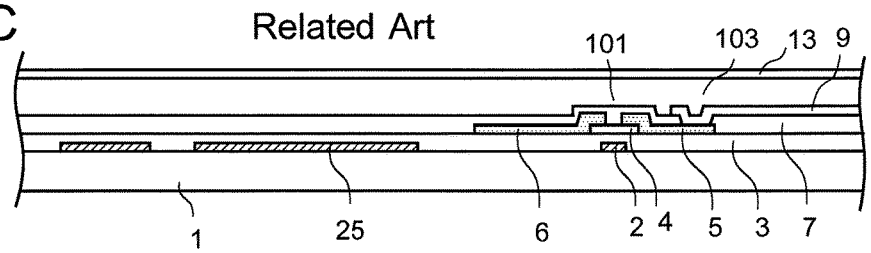
Figure 9D:
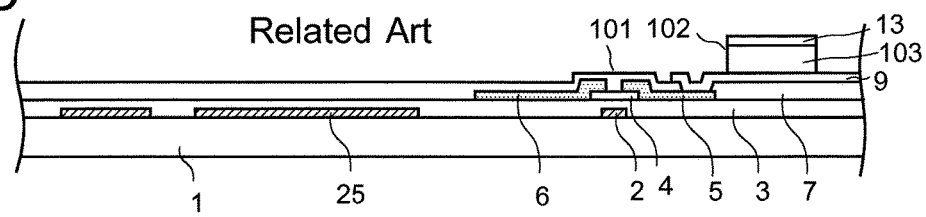
Figure 9E:
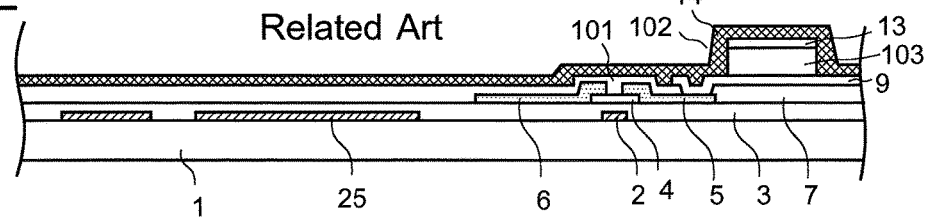
Figure 9F:
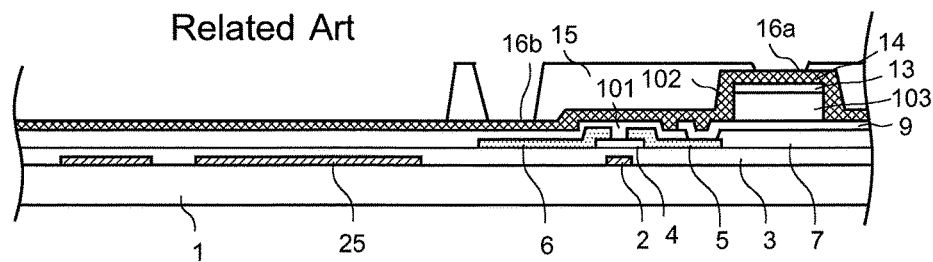
Figure 9G:
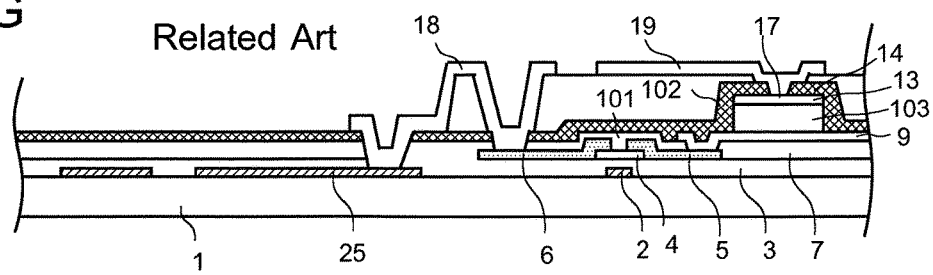
Figure 9H:
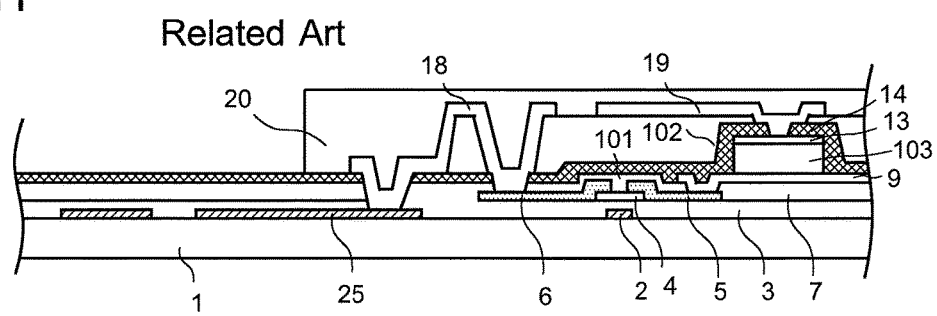
Figure 10:
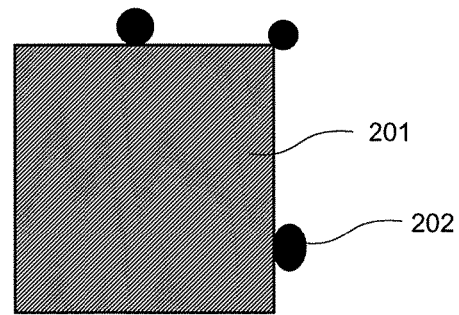
FIG. 10 is a diagram illustrating an example of a layer separation of a photoelectric conversion layer caused in manufacturing steps of the array substrate to be mounted on the conventional photoelectric conversion device.

However, in a conventional art (as shown in FIG. 8), the following problems have been caused when components with different thermal expansion coefficients such as passivation layer 7 and patterned lower electrode 9 were formed in a base on which the thick layer is to be formed as shown in FIG. 9C. In this structure, each component exhibited the different amount of heat shrinkage from others, and concentration of membrane stress was caused at the boarder of the patterned lower electrode 9, which generated local layer separation 202 of the photoelectric conversion layer along the surface of patterned lower electrode 201 as shown in FIG. 10.

In view of that, in the present example, the whole area of the base in the layer-forming step and patterning step of photoelectric conversion layer 103 has been formed by a layer to be formed in to lower electrode 9 as shown in FIG. 3C. This structure did not make a part in which difference of stress is locally generated due to adhesion to the base and expansion and/or shrinkage of the photoelectric conversion layer, and provided a great effect to restrict the separation of photoelectric conversion layer 103.

Under the situation that a layer to be formed into lower electrode 9 is provided as a base covering the whole area used in the layering step and patterning step of depositing and photoelectric conversion layer 103 as a countermeasure against the layer separation, the patterned lower electrode 9 is naturally to be formed after the patterning process of photoelectric conversion layer 103. In other words, processes required to pattern the layer of lower electrode 9, such as a photolithography process and an etching treatment, are required to be performed after the edge surface of the patterned photoelectric conversion layer 103 is exposed. When the above processes are performed under the condition that the edge surface of the patterned photoelectric conversion layer 103 is exposed, it results in substantial contamination of the edge surface of the patterned photoelectric conversion layer 103. The contamination of the edge surface can cause a generation of an electric leakage path of photodiode 102, and results in an increase of leakage current, in other words, dark current, under the condition that photodiode 102 is made reverse biased and in deterioration of photodiode characteristics.

In the present example, a layer of first protecting film 14 is formed on the structure that the patterned photoelectric conversion layer 103 and the patterned upper electrode 13 are formed on the base wherein the layer of lower electrode 9 provided to cover the whole area, as shown in FIG. 3E. In other words, the layer of first protecting film 14 is formed right after the edge surface of the patterned photoelectric conversion layer 103 is exposed. Thereby, the exposed edge surface of the patterned photoelectric conversion layer 103 is not required to be subjected to unnecessary processes and the generation of an electric leakage path coming from the contamination can be avoided.

Figure 7:
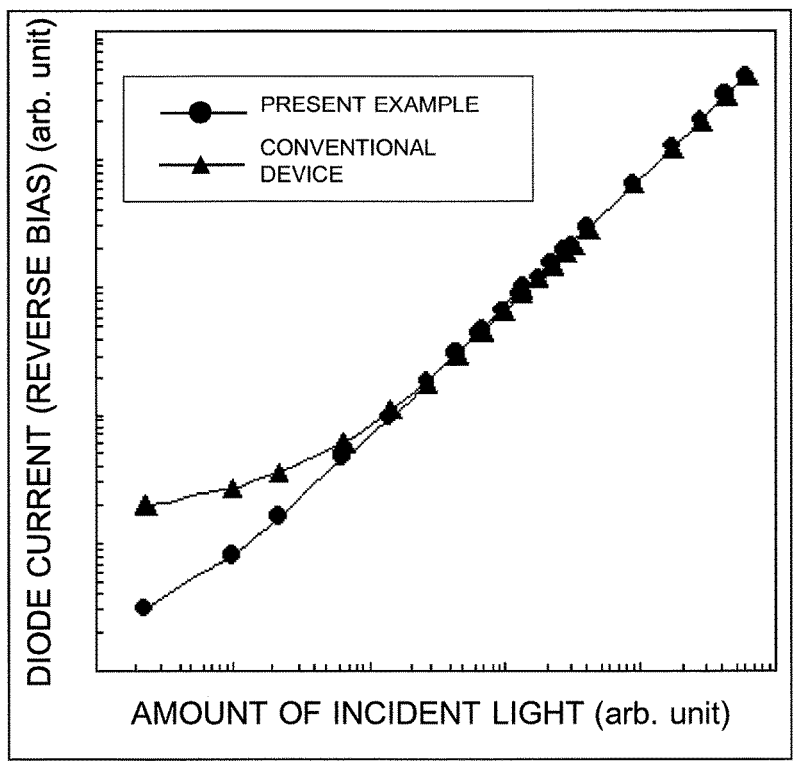
FIG. 7 is a graph generally illustrating effects of the photoelectric conversion device of the present embodiment.

To describe the above effect, FIG. 7 illustrates a summary of measurement results of diode current corresponding to charges which are subjected to photoelectric conversion, for the various amounts of incident light. In the area of the graph where the amount of incident light is extremely small, the diode current of the conventional structure does not decrease in proportion to the light amount and is saturated at the value of the dark current. On the other hand, the diode current of the present example decreases to be almost proportional to the light amount in the area. This enhancement realizes a photoelectric conversion device with high sensitivity, which allows taking images under a lower-level radiation when the device is applied to radiation imaging and allows providing a medical diagnosis apparatus capable of reducing patient radiation exposure.

After that, first protecting film 14 and lower electrode 9 are formed with the same mask pattern, as shown in FIG. 3F, to complete photodiode 102. Since this process using the same mask pattern is performed by the same photolithography step, there is no need to consider the manufacturing margin such as displacement of their patterns which can be caused when the process is divided into two photolithography steps. The resulting structure does not make the deterioration of the received-light sensitivity of the diode coming from reduction of the fill factor, and does not increase the number of masks to be used in the processing and the number of manufacturing steps.

The present example does not cause the layer separation in and after the period of forming the photodiode, restricts the level of dark current coming from an electric leakage path on the edge surface of the patterned photoelectric conversion layer, does not make the deterioration of existing characteristics of the diode such as received-light sensitivity, and does not increase the manufacturing cost.

Further, the structure of the example further provides the following effects which are not a combination of existing effects. An array substrate is composed of plural layers and plural interlayer films, wherein the components are connected through contact holes to another. In this structure, increase of the depth of contact holes (thickness of the interlayer films) causes various problems in manufacturing processes, for example, increase of lead time coming from performing an etching treatment on a thick interlayer film, quality change and sticking of a photo-resist film coming from a prolonged etching period, and an interlayer short circuit made due to a penetration because of an etching treatment at a pinhole section of the photo resist. However, in the present example, first protecting film 14 covering the patterned edge surface of the photoelectric conversion layer 103 is placed just on an area where the lower electrode 9 exists as the above-described structure, which reduces layers to be etched to form a contact hole by one layer and provides additional effect that the above-described problems which can be caused in the manufacturing processes can be reduced.

Figure 9I:
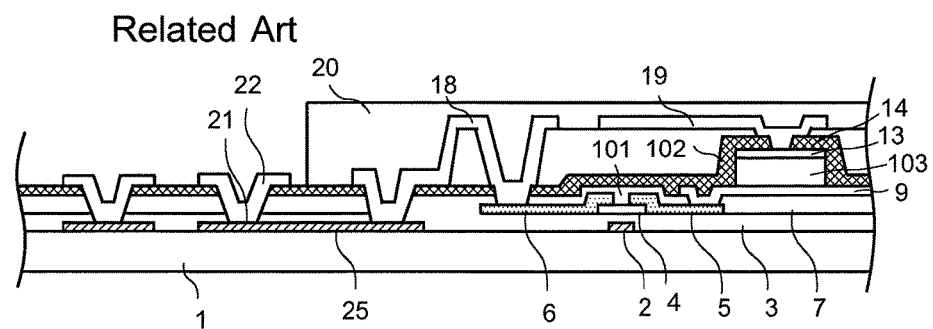

Illustrating a terminal part of the gate layer concretely, the conventional structure requires performing an etching treatment on three interlayer films including first protecting film 14, passivation layer 7 and gate insulating layer 3, as shown in FIG. 9I. However, the present example does not require performing an etching treatment on more than two interlayer films including passivation layer 7 and gate insulating layer 3, as shown in FIG. 3J.

Example 2

Figure 5:
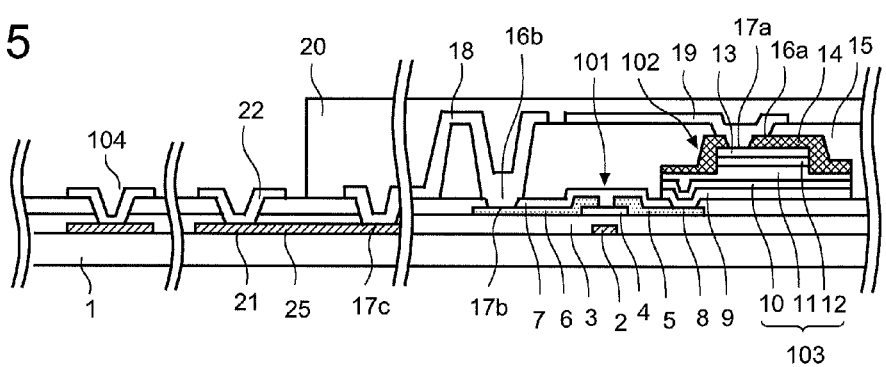
FIG. 5 is a sectional view illustrating an array substrate to be mounted on a photoelectric conversion device of Example 2.

Next, a structure of an array substrate of Example 2 will be described with reference to FIG. 5. FIG. 5 is a sectional view illustrating a structure of an array substrate to be mounted on a photoelectric conversion device of Example 2, and corresponds to a cross section taken along the line II-II of FIG. 1 for Example 1.

There is provided substrate 1 with gate lines 2 and gate insulating layer 3 being put thereon, and patterned semiconductor layer 4 is formed over the substrate 1, gate lines 2 and gate insulating layer 3. On the semiconductor layer 4, there are arranged source electrode 5 and drain electrode 6 which are separated from each other at a distance corresponding to a channel length, and then, passivation layer 7 is formed to cover them to form thin-film transistor 101. Next, on the passivation layer 7, photodiodes 102 are arranged. Each of the photodiodes 102 includes lower electrode 9 and upper electrode 13 facing each other, patterned photoelectric conversion layer 103 formed between the lower electrode 9 and upper electrode 13, and first protecting film 14 as a protecting film. The first protecting film 14 except for an area where a contact hole is formed and the lower electrode are formed with a same-shaped pattern. The patterned photoelectric conversion layer 103 is composed of, in this order from the lower side, $n^+$-doped hydrogenated amorphous silicon layer 10, intrinsic hydrogenated amorphous silicon layer 11 and $p^+$-doped hydrogenated amorphous silicon layer 12. The i-Si layer is formed into a stepped shape. Further, source electrode 5 is connected to lower electrode 9 through first contact hole 8 formed on passivation layer 7 so as to connect thin-film transistor 101 to photodiode 102.

On the workpiece, there are arranged second protecting film 15, bias lines 19 and signal lines 18. The upper electrode 13 and bias line 19 are connected to each other through second contact hole 16a formed through second protecting film 15 and third contact hole 17a formed through first protecting film 14. The drain electrode 6 and signal line 18 are connected to each other through second contact hole 16b formed through second protecting film 15 and third contact hole 17b formed through passivation layer 7. The signal line 18 and lead line 25 extending from a terminal are connected to each other through third contact hole 17c formed through gate insulating layer 3 and passivation layer 7.

Further on the workpiece, third protecting film 20 is formed to cover thin-film transistors 101, photodiodes 102, signal lines 18 and third contact holes 17c. Terminal 104 has a structure that lead line 25 and terminal electrode 22 are connected to each other through fourth contact hole 21 formed through gate insulating layer 3 and passivation layer 7.

Next, a method of manufacturing the array substrate having the above structure will be described with reference to FIGS. 6A to 6J. FIGS. 6A to 6J are sectional views illustrating manufacturing processes of the array substrate to be mounted on the photoelectric conversion device of the present example.

Figure 6A:
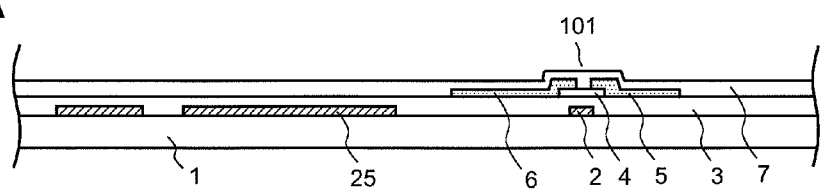
FIGS. 6A to 6J are sectional views illustrating manufacturing steps of the array substrate to be mounted on the photoelectric conversion device of Example 2.
Figure 6B:
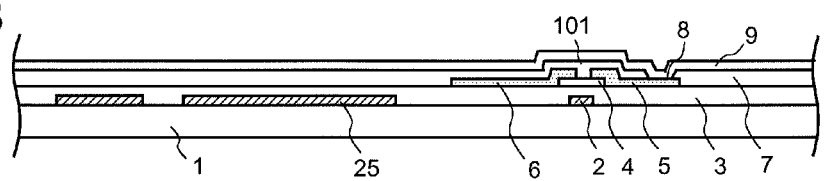
Figure 6C:
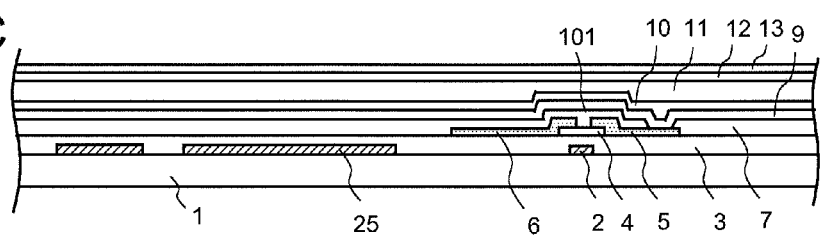

Steps illustrated in FIGS. 6A to 6C are the same as those of Example 1.

Figure 6D:
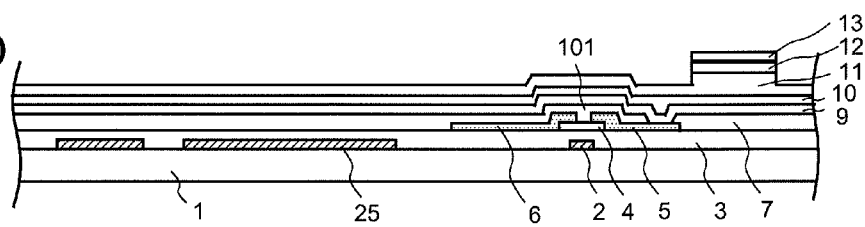

Next, as illustrated in FIG. 6D, a layer to be formed into upper electrode 13 and a layer to be formed into $p^+$-Si layer 12 are etched sequentially from an upper layer with the same resist mask and are formed into the almost same shape. Successively, by performing the first etching treatment to etch i-Si layer 11 up to the midway thickness, the upper part of the layer is patterned into a patterned shape which is almost the same as those of upper electrode 13 and p+-Si layer 12, and the lower part of the layer is remained with covering the whole processing area. In such a half etching treatment, there are caused problems about a control of the etching treatment and in-plane distribution of the remaining layer. However, in the present example, the half-etching technique used for semiconductor layer 4 on forming a channel section of thin-film transistor 101 can be used also for the i-Si layer 11, and i-Si layer 11 is formed to be thicker than at least the semiconductor layer 4. Therefore, the tolerance of the control to stop etching the i-Si layer 11 at a midway thickness is great. Further, the in-plane distribution of the remaining layer after the half-etching process of i-Si layer 11 is required to be just on the level that at least a part of the layer remains on the whole of the processing area. Therefore, i-Si layer 11 can be formed without increasing the degree of difficulty of the manufacturing technique.

Assuming the situation that photoelectric conversion layer 103 is etched until the layer of lower electrode 9 is exposed, the etching treatment advances in no small degrees depending on the material of the lower electrode 9, the edge surface of the patterned photoelectric conversion layer 103 can be contaminated by contaminants including material of lower electrode 9. In view of that, since the etching process is stopped at a midway thickness of i-Si layer 11, a layer of lower electrode 9 is not exposed and the surface exposed by the etching process of i-Si layer 11 (hereinafter, referred as the edge surface) is not contaminated by the contaminants including material of lower electrode 9. As described above, since photoelectric conversion layer 103 has been layered to be thick, etching the structure can cause a great side etching (which is a phenomenon that the layer is patterned to be smaller in size than the size of the resist pattern). In view of that, when the layer of upper electrode 13 is selectively etched, upper electrode 13 is formed to be smaller than the final size of patterned photoelectric conversion layer 103 by about 1 μm to 5 μm at each side part. It avoids forming a structure in a canopy shape such that upper electrode 13 becomes larger than photoelectric conversion layer 103, which makes the tapered shape of photoelectric conversion layer 103 in good condition and improves coatability of layers to be formed on structures including the upper electrode 13 in the following steps.

Figure 6E:
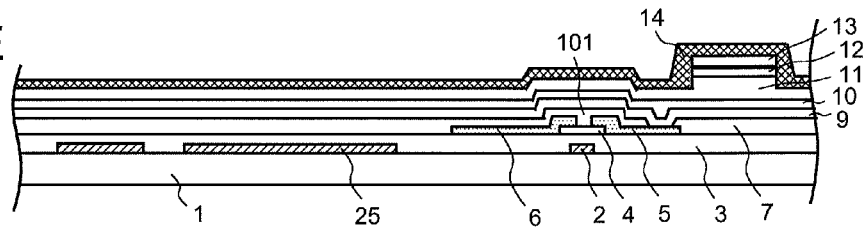

Next, as shown in FIG. 6E, a layer to be formed into first protecting film 14 is formed to be 100 nm to 500 nm in thickness by using one of a silicon nitride layer and silicon oxide layer or multiple layers of them, so as to cover the patterned edge surfaces of upper electrode 13, p+-Si layer 12 and i-Si layer 11. Because right after the edge surface of the patterned i-Si layer 11 has been exposed, the edge surface is subjected to a minimum necessary cleaning process such as washing and then is covered by first protecting film 14, the contamination on the edge surface of the patterned i-Si layer 11 can be reduced to the minimum level.

Figure 6F:
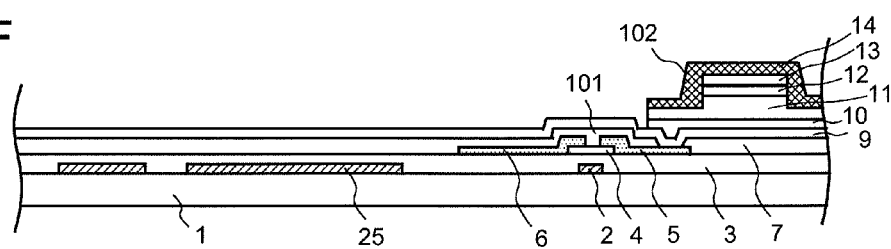

Next, as shown in FIG. 6F, layers of first protecting film 14, a remaining part of i-Si layer 11, n+-Si layer 10 and lower electrode 9 are etched with a resist mask which has a larger pattern than that of upper electrode 13, sequentially from an upper layer, to be formed into the almost same-shaped pattern. Thereby, photodiode 102 is formed to have a structure that i-Si layer 11 has a stepped shape and at least first protecting film 14 and lower electrode 9 are formed with the same pattern. In this step, the patterned lower electrode 9 is formed to be larger by about 1 μm to 3 μm than the size of the patterned upper electrode 13 to secure a margin for patterning them in order to avoid displacement of the patterns. When layers of first protecting film 14, i-Si layer 11 and n+-Si layer 10 are etched, a layer of lower electrode 9 exists as a base covering the whole of the processing area, and the layer of lower electrode 9 works as an etching stopper. This structure allows selectable removing of the layer to be first protecting film 14 with remaining a part where the resist mask is placed by an etching treatment, which does not increase the thickness of interlayer film excessively and contributes to a reduction of the lead time of the device and of damages coming from an etching treatment which can be caused in the succeeding steps to form contact holes.

As described in the explanation about FIG. 6D, assuming that the layer of lower electrode 9 is exposed as an etching stopper, not a few level of contamination coming from contaminants including material of lower electrode 9 can be generated and the contamination affects the edge surface of the lower part of i-Si layer 11. However, since i-Si layer 11 is formed into a stepped shape, a path length on the edge surfaces of i-Si layer 11 from upper electrode 13 to lower electrode 9 is elongated by the length of a part of i-Si layer 11 corresponding to a stair of the stepped shape (an area extending in the horizontal direction rather than the thickness direction). Further, such a shape allows forming an area which is not contaminated by the etching treatment performed on lower electrode 9, on the edge surface of the upper part of i-Si layer 11 and the stair of the stepped shape of i-Si layer 11. Especially when the layer thickness of i-Si layer 11 is smaller than the length of the stair of the step of i-Si layer 11, in other words, when the layer thickness of i-Si layer 11 is smaller than the projecting length of the patterned lower electrode 9 from the patterned upper electrode 13, the path length on the edge surface from upper electrode 13 to lower electrode 9 becomes longer than that of the structure having a non-stepped shape, and the path on the edge surface can provide higher resistance.

Figure 6G:
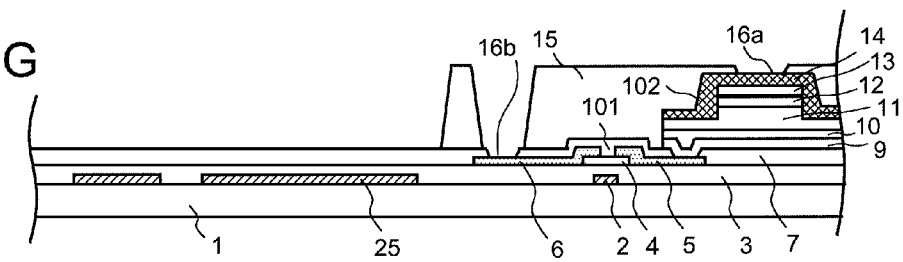
Figure 6H:
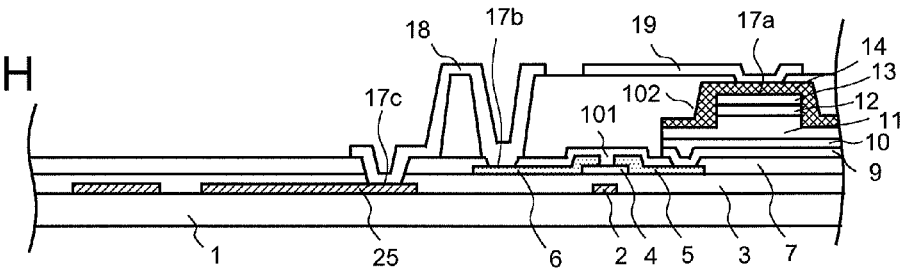
Figure 6I:
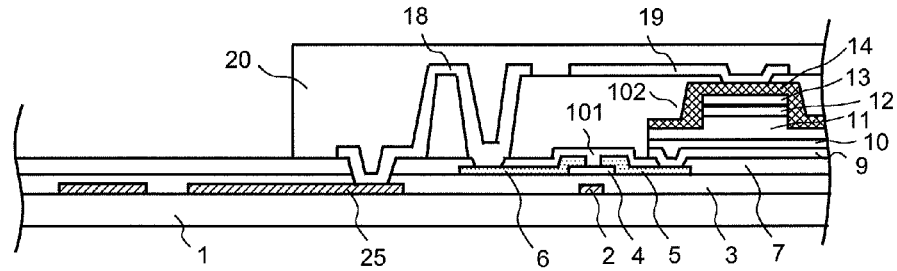
Figure 6J:
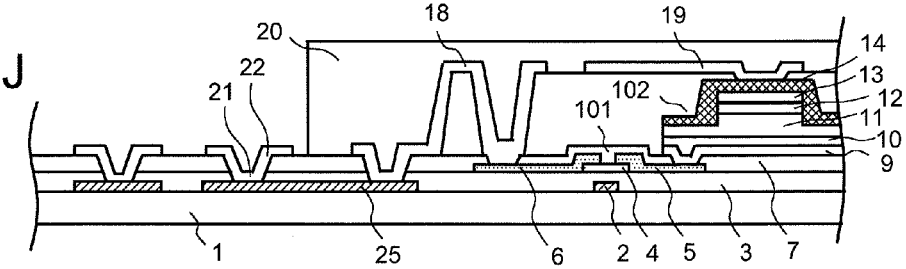

The succeeding steps corresponding to FIGS. 6G to 6I are same as those of Example 1.

Example 2 provides the same effects as those of Example 1. Additional effects will be described with reference to FIGS. 6A to 6I and 11.

Next, as illustrated in FIG. 6D, a layer to be formed into upper electrode 13 and a layer to be formed into p+-Si layer 12 are etched sequentially from an upper layer with the same resist mask and are formed into the almost same pattern shapes. Successively, the first etching treatment to etch i-Si layer 11 midway through the thickness is performed so as to form the upper part of the layer is formed into a pattern shape which is almost the same as those of upper electrode 13 and p+-Si layer 12 and to remain the lower part of the layer covering the whole surface. If the photoelectric conversion layer 103 is etched until the layer of lower electrode 9 is exposed, the etching treatment advances in no small degrees depending on the material of the lower electrode 9, the edge surface of the patterned photoelectric conversion layer 103 can be contaminated by contaminants including material of lower electrode 9. In view of that, since the etching process is stopped at a midway thickness of i-Si layer 11, a layer of lower electrode 9 is not exposed and the surface exposed by the etching process of i-Si layer 11 is not contaminated by the contaminants including material of lower electrode 9.

Next, as shown in FIG. 6E, the surface is subjected to a minimum necessary cleaning process such as washing and then is covered by first protecting film 14 right after the edge surface of the patterned photoelectric conversion layer 103 has been exposed, in order to reduce the contamination on the edge surface of the patterned i-Si layer 11 to the minimum level. As shown in FIG. 6F, the second etching treatment to sequentially etch layers of first protecting film 14, i-Si layer 11, n+-Si layer 10 and lower electrode 9 with a mask pattern which is larger than that of upper electrode 13 is performed, and then i-Si layer 11 formed into a stepped shape is provided.

Figure 11:
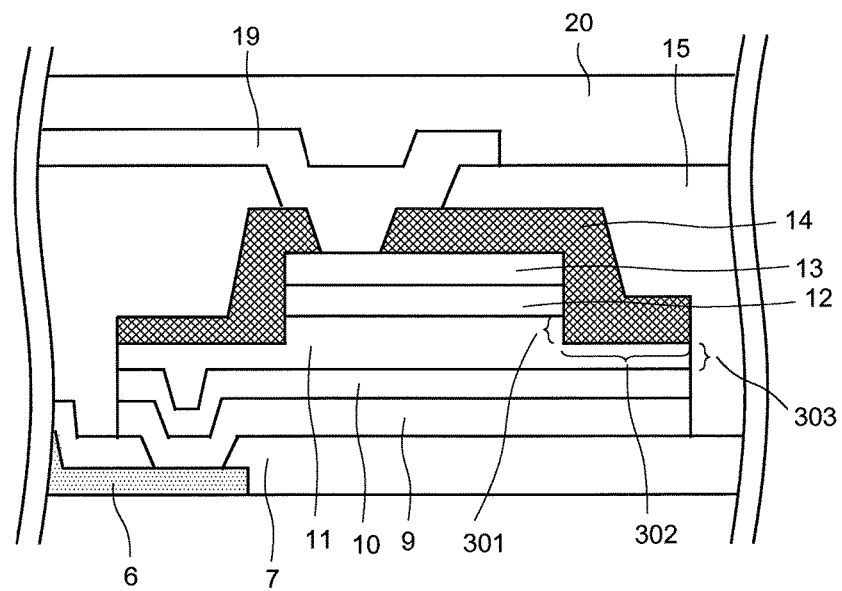
FIG. 11 is a sectional view illustrating a structure of a photoelectric conversion layer to be placed in the photoelectric conversion device of Example 2.

FIG. 11 illustrates the stepped shape of i-Si layer 11 relating to Example 2. Since the second etching treatment is performed under the condition that edge surface 303 of the lower part of i-Si layer 11 is exposed. Therefore, not a few level of contamination coming from contaminants including material of lower electrode 9 can be generated and the contamination affects the edge surface of the lower part of i-Si layer 11. However, since i-Si layer 11 is formed into a stepped shape, a path length on the edge surface of i-Si layer 11 from upper electrode 13 to lower electrode 9 is elongated by the length of a part 302 of i-Si layer 11 corresponding to a stair of the stepped shape. Especially when the layer thickness of i-Si layer 11 is smaller than the length of the stair part 302 of the step of i-Si layer 11, the path length on the edge surface from upper electrode 13 to lower electrode 9 clearly becomes longer than that of the structure having a non-stepped shape, and the path on the edge surface can provide higher resistance.

According to the above structure and processing, contamination on the edge surface of patterned i-Si layer 11 coming from the etching treatment on lower electrode 9 can be restricted and the level of dark current on the edge-surface path can be reduced.

Figure 12:
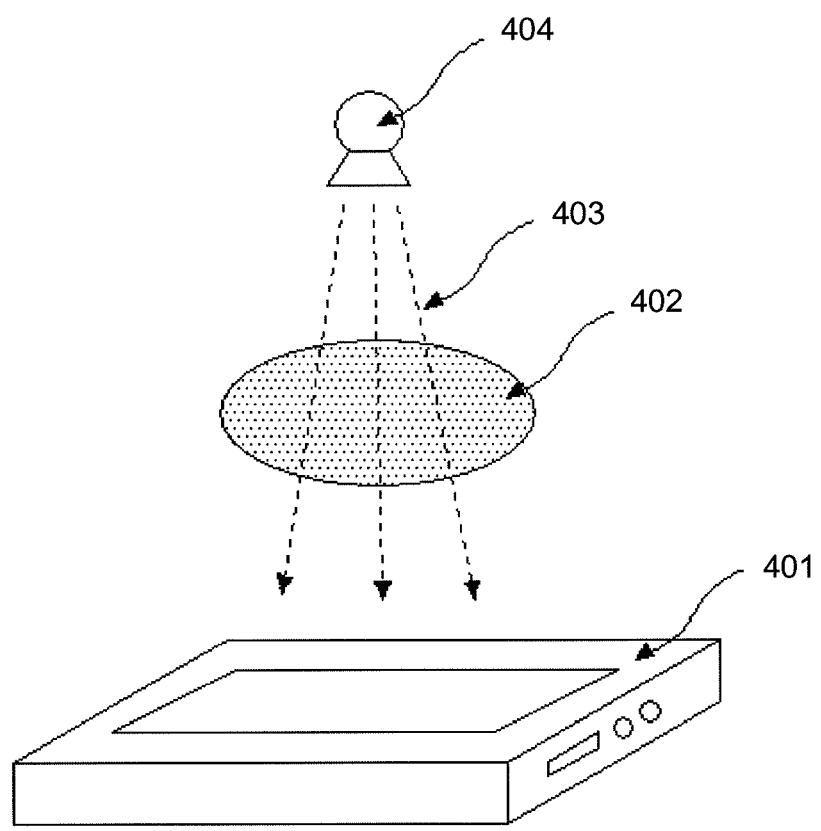
FIG. 12 is a perspective view of an X-ray image detector of the present embodiment.

FIG. 12 is a perspective view of an X-ray image detector employing the photoelectric conversion device relating to any of the above examples. FIG. 12 illustrates X-ray image detector (flat panel detector) 401, test object 402, X-ray 403 and X-ray source 404.

The present invention is applicable to a photodiode array substrate on which photodiodes connected to thin-film transistors are arrayed in a matrix, a method of manufacturing the same, and an X-ray image detector equipped with the PD array substrate.

According to the above embodiments, there can be provided a photoelectric conversion device equipped with a photodiode exhibiting high sensitivity and having a structure not to cause separation of a photoelectric conversion layer; a method of manufacturing the photoelectric conversion device which achieves manufacture of the device without increasing the cost; and an X-ray image detector equipped with the photoelectric conversion device.

While the present embodiments of the present invention have been described using specific terms, such description is for illustrative purpose only, and it is to be understood that changes and variations may be made without departing from the spirit or scope of the appended claims. For example, though a PIN photodiode is used in the above examples as a photodiode, an MIS (Metal Insulator Silicon) photodiode may be used in place of the PIN photodiode.

The invention claimed is:

1. A photoelectric conversion device comprising:
   a photodiode device formed on a substrate and including
      a lower electrode and an upper electrode facing each other,
      a photoelectric conversion layer between the lower electrode and the upper electrode, the photoelectric conversion layer comprising a sidewall surface, wherein the photoelectric conversion layer is smaller in size than the lower electrode and placed on a surface of the lower electrode, and
      a first protecting film covering the sidewall surface of the photoelectric conversion layer, a top surface of the upper electrode and of the lower electrode and a sidewall surface of the upper electrode, the lower electrode being laid under the first protecting film, the first protecting film comprising an outside edge being set at a same position as an outside edge of the lower electrode, the first protecting film comprising a contact hole that connects a bias line to the upper electrode, the bias line being placed over the first protecting film; and
   a second protecting film covering at least the photodiode device.

2. The photoelectric conversion device of claim 1, comprising:
   a plurality of the photodiode devices;
   a plurality of the bias lines each arranged over the first protecting film of each of the photodiode devices, each of the bias lines connected to the upper electrode of the each of the photodiode devices through the contact hole;
   a plurality of gate lines;
   a plurality of signal lines intersecting orthogonally with the gate lines; and
   a plurality of thin-film transistors each arranged at a position corresponding to an intersection portion where each of the gate lines and each of the signal lines intersect with each other, each of the thin-film transistors including a gate electrode connected to each of the gate lines, a gate insulating layer over the gate electrode, a semiconductor layer over the gate insulating layer, a drain electrode and a source electrode over the semiconductor layer, and a passivation layer over the drain electrode and the source electrode, the drain electrode being connected to each of the signal lines, the source electrode being arranged to face the drain electrode, each of the photodiode devices being put on each of the thin-film transistors with the source electrode being electrically connected to the lower electrode,
   wherein the thin-film transistors and the photodiode devices are arrayed in a matrix shape.

3. The photoelectric conversion device of claim 2, further comprising:
   a transparent interlayer dielectric layer over the photodiode devices and the thin-film transistors; and
   a scintillator over the transparent interlayer dielectric layer, the scintillator being configured to convert radial rays into visible rays to cause the photoelectric conversion device to perform radiological imaging.

4. The photoelectric conversion device of claim 3, further comprising terminals leading to the gate lines, the signal lines and the bias lines, wherein the transparent interlayer dielectric layer is formed over an area except where at least the terminals are arranged.

5. An X-ray image detector comprising the photoelectric conversion device of claim 1.

6. A photoelectric conversion device comprising:
   a photodiode device formed on a substrate and comprising
      a lower electrode and an upper electrode facing each other,
      a photoelectric conversion layer between the lower electrode and the upper electrode, the photoelectric conversion layer comprising an n+-silicon layer, an intrinsic-silicon layer and a p+-silicon layer in order from a side of the lower electrode, the upper electrode, the p+-silicon layer and a part of the intrinsic silicon layer at a side of the p+-silicon layer having a same outside edge, the lower electrode, the n+-silicon layer and a part of the intrinsic silicon layer at a side of the n+-silicon layer having a same outside edge, the intrinsic-silicon layer having a stepped shape along a sidewall surface thereof, and a first protecting film covering a top surface and a sidewall surface of the upper electrode, a sidewall surface of the p+-silicon layer, and the sidewall surface and a top surface of the part of the intrinsic silicon layer, the first protecting film comprising an outside edge being set at a same position as an outside edge of each of the lower electrode, the n+-silicon layer and a part of the intrinsic silicon layer at a side of the n+-silicon layer, and the first protecting film comprising a contact hole that connects a bias line to the upper electrode, the bias line being placed over the first protecting film; and a second protecting film covering at least the photodiode device.

7. The photoelectric conversion device of claim 6, wherein the lower electrode and the upper electrode face each other with the lower electrode formed in a size larger than the upper electrode, the size being larger by a projecting length from a periphery edge of the upper electrode, and a layer thickness of the intrinsic-silicon layer is smaller than the projecting length.

8. The photoelectric conversion device of claim 6, comprising:
a plurality of the photodiode devices;
a plurality of the bias lines each arranged over the first protecting film of each of the photodiode devices, each of the bias lines connected to the upper electrode of the each of the photodiode devices through the contact hole;
a plurality of gate lines;
a plurality of signal lines intersecting orthogonally with the gate lines; and
a plurality of thin-film transistors each arranged at a position corresponding to an intersection portion where each of the gate lines and each of the signal lines intersect with each other, each of the thin-film transistors including a gate electrode connected to each of the gate lines, a gate insulating layer over the gate electrode, a semiconductor layer over the gate insulating layer, a drain electrode and a source electrode over the semiconductor layer, and a passivation layer over the drain electrode and the source electrode, the drain electrode being connected to each of the signal lines, the source electrode being arranged to face the drain electrode, each of the photodiode devices being put on each of the thin-film transistors with the source electrode being electrically connected to the lower electrode,
wherein the thin-film transistors and the photodiode devices are arrayed in a matrix shape.

9. The photoelectric conversion device of claim 8, further comprising:
a transparent interlayer dielectric layer over the photodiode devices and the thin-film transistors; and
a scintillator over the transparent interlayer dielectric layer, the scintillator being configured to convert radial rays into visible rays to cause the photoelectric conversion device to perform radiological imaging.

10. The photoelectric conversion device of claim 9, further comprising terminals leading to the gate lines, the signal lines and the bias lines,
wherein the transparent interlayer dielectric layer is formed over an area except where at least the terminals are arranged.

11. An X-ray image detector comprising the photoelectric conversion device of claim 6.

12. A photoelectric conversion device comprising:
a plurality of photodiode devices formed on a substrate, and each of the photodiode devices including:
a lower electrode and an upper electrode facing each other;
a photoelectric conversion layer between the lower electrode and the upper electrode, the photoelectric conversion layer comprising a sidewall surface, wherein the photoelectric conversion layer is smaller in size than the lower electrode and placed on a surface of the lower electrode;
a first protecting film covering the sidewall surface of the photoelectric conversion layer, and a top surface and a sidewall surface of the upper electrode, the first protecting film comprising an outside edge being set at a same position as an outside edge of the lower electrode, the first protecting film comprising a contact hole that connects a bias line to the upper electrode, the bias line being placed over the first protecting film;
a second protecting film covering at least the photodiode device;
a plurality of the bias lines each arranged over the first protecting film of each of the photodiode devices, each of the bias lines connected to the upper electrode of the each of the photodiode devices through the contact hole;
a plurality of gate lines;
a plurality of signal lines intersecting orthogonally with the gate lines;
a plurality of thin-film transistors each arranged at a position corresponding to an intersection portion where each of the gate lines and each of the signal lines intersect with each other, each of the thin-film transistors including a gate electrode connected to each of the gate lines, a gate insulating layer over the gate electrode, a semiconductor layer over the gate insulating layer, a drain electrode and a source electrode over the semiconductor layer, and a passivation layer over the drain electrode and the source electrode, the drain electrode being connected to each of the signal lines, the source electrode being arranged to face the drain electrode, each of the photodiode devices being put on each of the thin-film transistors with the source electrode being electrically connected to the lower electrode;
a transparent interlayer dielectric layer over the photodiode devices and the thin-film transistors;
a scintillator over the transparent interlayer dielectric layer, the scintillator being configured to convert radial rays into visible rays to cause the photoelectric conversion device to perform radiological imaging; and
terminals leading to the gate lines, the signal lines and the bias lines,
wherein the thin-film transistors and the photodiode devices are arrayed in a matrix shape, and the transparent interlayer dielectric layer is formed over an area except where at least the terminals are arranged.

13. An X-ray image detector comprising the photoelectric conversion device of claim 12.

14. A photoelectric conversion device comprising:
a photodiode device formed on a substrate and comprising:
a lower electrode and an upper electrode facing each other;
a photoelectric conversion layer between the lower electrode and the upper electrode, the photoelectric conversion layer comprising an n+-silicon layer, an intrinsic-silicon layer and a p+-silicon layer in order from a side of the lower electrode, the upper electrode, the p+-silicon layer and a part of the intrinsic silicon layer at a side of the p+-silicon layer having a same outside edge, the lower electrode, the n+-silicon layer and a part of the intrinsic silicon layer at a side of the n+-silicon layer having a same outside edge, the intrinsic-silicon layer having a stepped shape along a sidewall surface thereof;
a first protecting film covering a top surface and a sidewall surface of the upper electrode, a sidewall surface of the p+-silicon layer and the sidewall surface of the part of the intrinsic silicon layer, the first protecting film comprising an outside edge being set at a same position as an outside edge of each of the lower electrode, the n+-silicon layer and a part of the intrinsic silicon layer at a side of the n+-silicon layer, and the first protecting film comprising a contact hole that connects a bias line to the upper electrode, the bias line being placed over the first protecting film; and
a second protecting film covering at least the photodiode device.

15. The photoelectric conversion device of claim 14, wherein the lower electrode and the upper electrode face each other with the lower electrode formed in a size larger than the upper electrode, the size being larger by a projecting length from a periphery edge of the upper electrode, and a layer thickness of the intrinsic-silicon layer is smaller than the projecting length.

16. The photoelectric conversion device of claim 14, comprising:
a plurality of the photodiode devices;
a plurality of the bias lines each arranged over the first protecting film of each of the photodiode devices, each of the bias lines connected to the upper electrode of the each of the photodiode devices through the contact hole;
a plurality of gate lines;
a plurality of signal lines intersecting orthogonally with the gate lines; and
a plurality of thin-film transistors each arranged at a position corresponding to an intersection portion where each of the gate lines and each of the signal lines intersect with each other, each of the thin-film transistors including a gate electrode connected to each of the gate lines, a gate insulating layer over the gate electrode, a semiconductor layer over the gate insulating layer, a drain electrode and a source electrode over the semiconductor layer, and a passivation layer over the drain electrode and the source electrode, the drain electrode being connected to each of the signal lines, the source electrode being arranged to face the drain electrode, each of the photodiode devices being put on each of the thin-film transistors with the source electrode being electrically connected to the lower electrode,
wherein the thin-film transistors and the photodiode devices are arrayed in a matrix shape.

17. The photoelectric conversion device of claim 16, further comprising:
a transparent interlayer dielectric layer over the photodiode devices and the thin-film transistors; and
a scintillator over the transparent interlayer dielectric layer, the scintillator being configured to convert radial rays into visible rays to cause the photoelectric conversion device to perform radiological imaging.

18. The photoelectric conversion device of claim 17, further comprising terminals leading to the gate lines, the signal lines and the bias lines,
wherein the transparent interlayer dielectric layer is formed over an area except where at least the terminals are arranged.

19. An X-ray image detector comprising the photoelectric conversion device of claim 14.

\* \* \* \* \*